United States Patent

Jinbo

Patent Number: 5,862,079
Date of Patent: Jan. 19, 1999

[54] METHOD AND DEVICE FOR ERASING NON-VOLATILE SEMICONDUCTOR MEMORY WITH SMALLER ERASE VARIATION

[75] Inventor: Toshikatsu Jinbo, Tokyo, Japan

[73] Assignee: NEC Corporation, Tokyo, Japan

[21] Appl. No.: 988,446

[22] Filed: Dec. 10, 1997

[30] Foreign Application Priority Data

Dec. 10, 1996 [JP] Japan .................................. 8-329846

[51] Int. Cl.⁶ .................................................. G11C 16/04
[52] U.S. Cl. ..................................... 365/185.29; 365/218
[58] Field of Search ............................... 365/185.29, 218

[56] References Cited

U.S. PATENT DOCUMENTS

| | | | |
|---|---|---|---|
| 5,077,691 | 12/1991 | Haddad et al. .......................... | 365/218 |
| 5,485,423 | 1/1996 | Tang et al. .......................... | 365/185.29 |
| 5,535,158 | 7/1996 | Yamagata .......................... | 365/185.29 |
| 5,615,152 | 3/1997 | Bergemont .......................... | 365/185.29 |
| 5,629,893 | 5/1997 | Tang et al. .......................... | 365/185.29 |
| 5,703,808 | 12/1997 | Makwana et al. .................. | 365/185.29 |

Primary Examiner—Son T. Dinh
Attorney, Agent, or Firm—Whitham, Curtis & Whitham

[57] ABSTRACT

Step S1 is carried out to lower, at the beginning of erasing operation, a voltage across a drain of a memory cell below a positive voltage applied to a source for erasing and then step S2 is carried out to open the drain. At the beginning of the erasing operation, step S3 is carried out to apply the positive voltage to the source and then step S3-1 is carried out to apply a negative voltage to a gate. To complete the erasing operation, step S4 is carried out to force the gate to be at the ground level and then the source to be at the ground level.

15 Claims, 9 Drawing Sheets

METHOD AND DEVICE FOR ERASING NON-VOLATILE SEMICONDUCTOR MEMORY WITH SMALLER ERASE VARIATION

BACKGROUND OF THE INVENTION

The present invention relates to a method and a device for erasing a non-volatile semiconductor memory. The erasing method and device of the present invention is particularly suitable for a semiconductor memory such as a flash EEPROM that carries out write-in operation by using hot electron injection and is erased by FN (Fowler-Nordheim) tunneling.

Electrically erasable and programmable read-only memories (EEPROMs) are well known as an example of the non-volatile semiconductor memory. In the non-volatile semiconductor memories of the type described, a plurality of memory cells form a memory cell array. Each memory cell has a floating gate that is electrically insulated between a control gate of an MOS transistor and a silicon substrate.

Electrons trapped in the floating gates in the non-volatile semiconductor memory can be discharged by applying a zero voltage or a negative voltage and a positive voltage (e.g., +12 V) for electron discharge to the control gate and a source, respectively, with a drain of the memory cell being in a floating state. A high electrical field is generated from the source of the memory cell toward the floating gate, providing an FN (Fowler-Nordheim) current from the source of the memory cell to the floating gate. As is well known in the art, electrons travel in the opposite direction to electrical current does. Thus the electrons are discharged from the floating gate. The positive voltage is generally supplied through a source voltage control circuit for the electron discharge applied to the source of the memory cell for the electron discharge operation.

Examples of memory erase operation for such non-volatile semiconductor memories are disclosed in, for example, U.S. Pat. No. 5,077,691 (hereinafter, referred to as a first conventional example) and U.S. Pat. No. 5,485,423 (hereinafter, referred to as a second conventional example). Briefly, the first conventional example opens a drain (column line) of a memory cell during erase operation. A positive voltage (e.g., +5 V) and a negative voltage (e.g., −12 V) are applied to a source and a gate, respectively, of the memory cell to erase data. The second conventional example opens a drain of a memory cell during erase operation. A constant positive voltage (e.g., +5 V) is applied to a source of the memory cell. Simultaneously, a negative step-shaped voltage that is gradually decreased is applied to a gate of the memory cell.

If the drain in the first conventional example is opened with the column line carrying the voltage, a ratio of capacity (across the gate and the source) varies partially (line by line) increasing erase variation upon the erase operation due to the residual voltage. In addition, the timing to apply the voltage across the gate and the source may change operation mode into a channel erase mode.

The second conventional example has the effect of reducing the electrical field across a tunnel film. However, this second conventional example has the following drawbacks. The negative step-shaped voltage that is gradually decreased is controlled according to a time during which it is applied to, without detecting the voltage actually applied across the gate. The effect of the reduction of the electrical field thus depends on an erase rate, which is not considered to be sufficient. In addition, the problem of the erase variation is not solved as in the first conventional example.

SUMMARY OF THE INVENTION

Therefore, an object of the present invention is to provide a method for erasing a non-volatile semiconductor memory that ensures the optimum timing of voltage application to sources and gates during erase operation to reduce erase variation.

Another object of the present invention is to provide a method for erasing a non-volatile semiconductor memory that ensures positive erase operation by means of FN tunneling at an end of a source, with the maximum electrical field across the end of the source and a floating gate.

It is yet another object of the present invention to provide a device for erasing a non-volatile semiconductor memory that is suitable for the above-mentioned erasing method.

The method for erasing a non-volatile semiconductor memory according to the present invention opens drains of respective memory cells and applies a positive voltage to sources to erase data from the memory cells.

According to an aspect of the present invention, in a first erasing mode, first, second, and third steps are carried out successively. The first step is for discharging drains of respective memory cells to lower the voltage across each drain of the memory cell below a positive voltage applied to each source. The second step is for opening each drain of the memory cell. The third step is for applying the positive voltage to the sources of the respective memory cells. In a second erasing mode, fourth and fifth steps are carried out successively. The fourth step is for forcing the gates of the respective memory cells to be at the ground level, and the fifth step is for forcing the sources of the respective memory cells to be at the ground level.

A device for erasing a non-volatile semiconductor memory according to the present invention opens drains of respective memory cells and applies a positive voltage to sources to erase data from the memory cells.

According to an aspect of the present invention, the erasing device comprises a first circuit for use in discharging drains of respective memory cells to lower the voltage across each drain of the memory cell below a positive voltage applied to each source and then opening the drains of the memory cells, a second circuit for use in applying a positive voltage to the sources of the respective memory cells after the drains are opened, and a third circuit for use in forcing gates of the respective memory cells to be at the ground level. The second circuit forces the sources of the memory cells to be at the ground level after the gates of the memory cells reach the ground level.

DESCRIPTION OF THE PREFERRED EMBODIMENTS

Figure 1:
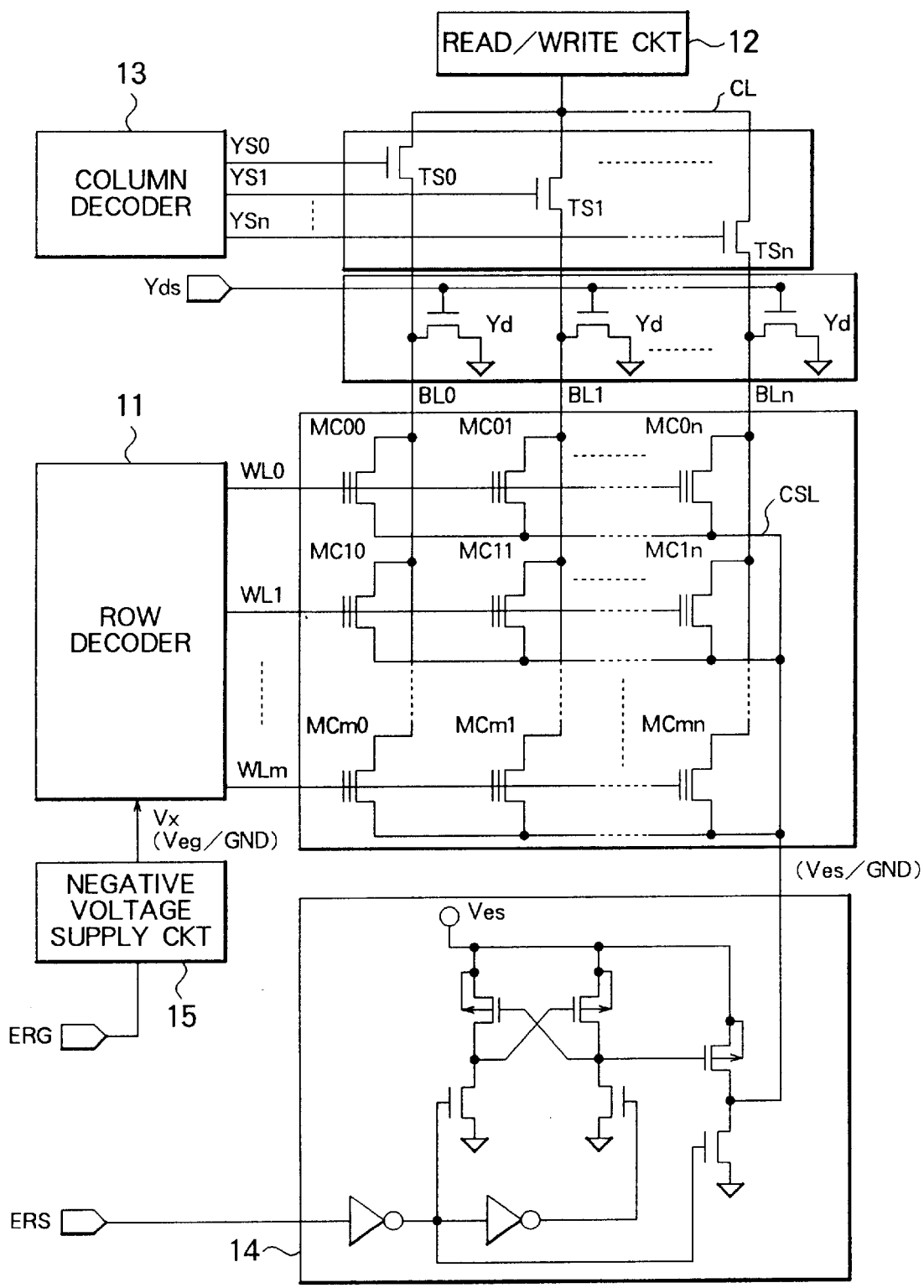
FIG. 1 is a view showing a part of a non-volatile semiconductor memory and a device for erasing a non-volatile semiconductor memory according to a first embodiment of the present invention.

Referring to FIG. 1, a method for erasing a non-volatile semiconductor memory according to a first embodiment of the present invention is described. FIG. 1 shows a part of a semiconductor memory and associated components, as well as an erasing device. The semiconductor memory comprises memory cells MC00 through MCmn. The memory cells MC00 through MCmn are connected to junctions between row lines WL0, WL1, . . . , WLm and column lines BL0, BL1, . . . , BLn, respectively. The row lines WL0 through WLm are connected to a row decoder 11. The column lines BL0 through BLn are connected to a common connection line CL via column selection transistors TS0, TS1, . . . , TSn. The common connection line CL is connected to a read/write circuit 12. Gates of the column selection transistors TS0 through TSn are connected to a column decoder 13 via column selection lines YS0, YS1, . . . , YSn. The above-mentioned components are the semiconductor memory and associated components. The present invention has the feature in that the following components are added to the above.

The column lines BL0, BL1, . . . , BLn between the memory cells MC00, MC01, . . . , MC0n and the column selection transistors TS0, TS1, . . . , TSn, respectively, are connected to drains of column discharge transistors Yd. The column discharge transistor Yd may be referred to as a first transistor. Gates of the column discharge transistor Yd are connected to a supply unit (not shown) for a column discharge control signal YdS. Sources of the column discharge transistor Yd are grounded. The column discharge transistors Yd are for discharging drain voltages across the memory cells MC00 through MCmn and for opening the drains.

Sources of the memory cells MC00 through MCmn are all connected to a common source line CSL. The common source line CSL is connected to a source voltage supply circuit 14. The source voltage supply circuit 14 is for applying a positive voltage to the sources of the memory cells MC00 through MCmn via the common source line CSL. The source voltage supply circuit 14 is connected to a supply unit (not shown) for an erasing source control signal ERS.

The row decoder 11 is connected to a negative voltage supply circuit 15. The negative voltage supply circuit 15 is connected to a supply unit (not shown) for an erasing gate control signal ERG. The negative voltage supply circuit 15 is for applying a negative voltage to the gates of the memory cells MC00 through MCmn via the row decoder 11 and the row lines WL0 through WLm.

With the above-mentioned configuration, the feature of the present invention lies in the following two points. The first point is that the voltage across the drain of the memory cell is lowered at the beginning of the erasing operation, below the positive voltage (preferably the ground level) applied to the source for erasing, and then the drain is opened. The second point is that the positive voltage is applied to the source of the memory cell at the beginning of the erasing operation and then a negative voltage is applied to the gate. At the end of the erasing operation, the voltage across the gate and then across the source is lowered to the ground level.

Next, the erasing operation is described with reference to FIGS. 2 through 4 together with FIG. 1. The column discharge control signal YdS, the erasing source control signal ERS, and the erasing gate control signal ERG are generated by a signal supply unit 20 shown in FIG. 4. The signal supply unit 20 comprises first, second, and third signal generation circuits 21, 22, and 23. The first signal generation circuit 21 generates the column discharge control signal YdS (see FIG. 3) in response to an erasing signal ER indicating to begin the erasing operation. The second signal generation circuit 22 generates the erasing source control signal ERS (see FIG. 3) in response to the erasing signal ER. The third signal generation circuit 23 generates the erasing gate control signal ERG (see FIG. 3) in response to the erasing signal ER. These circuits are described later.

Figure 2:
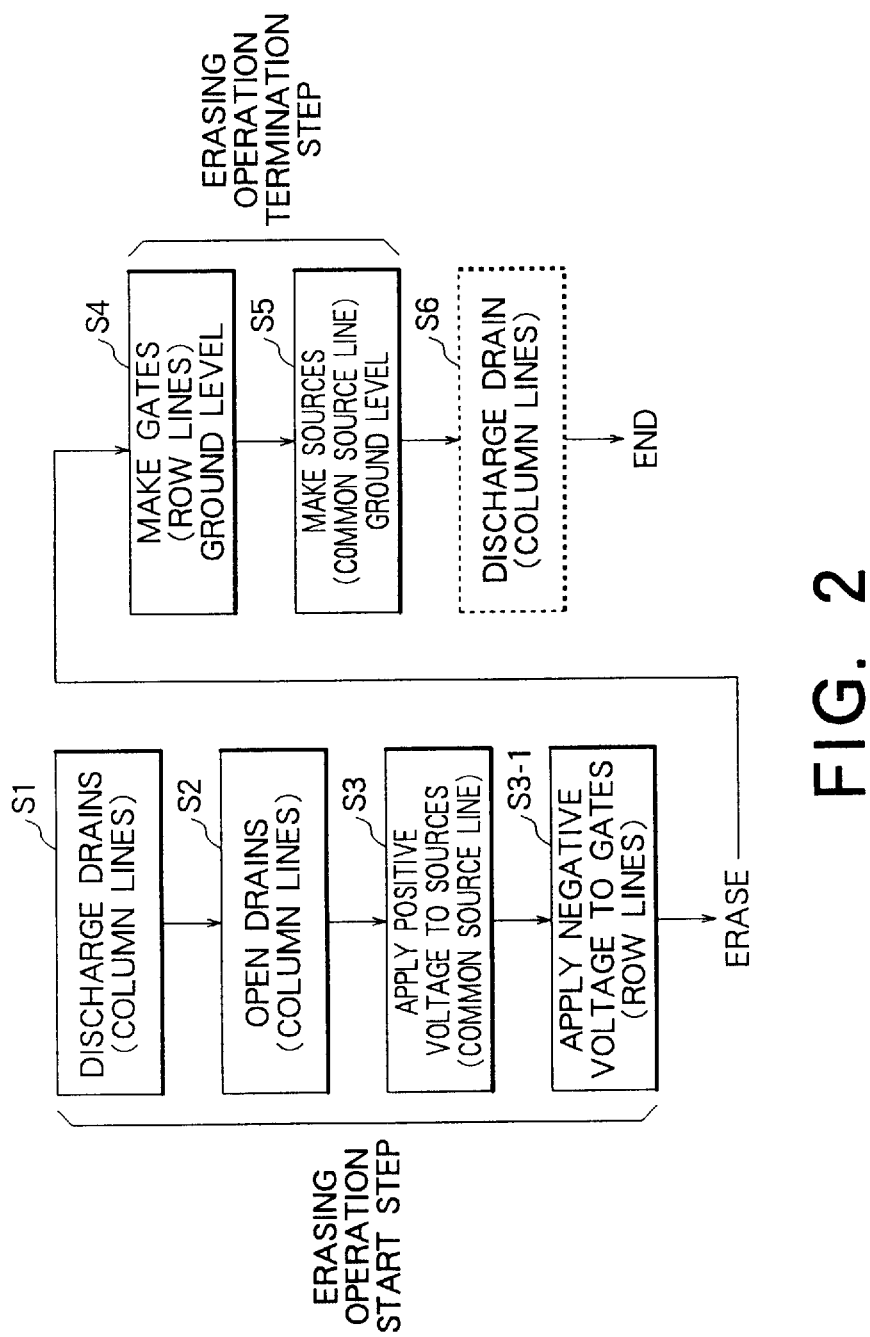
FIG. 2 is a flow chart for use in describing operation of the erasing device in FIG. 1.
Figure 3:
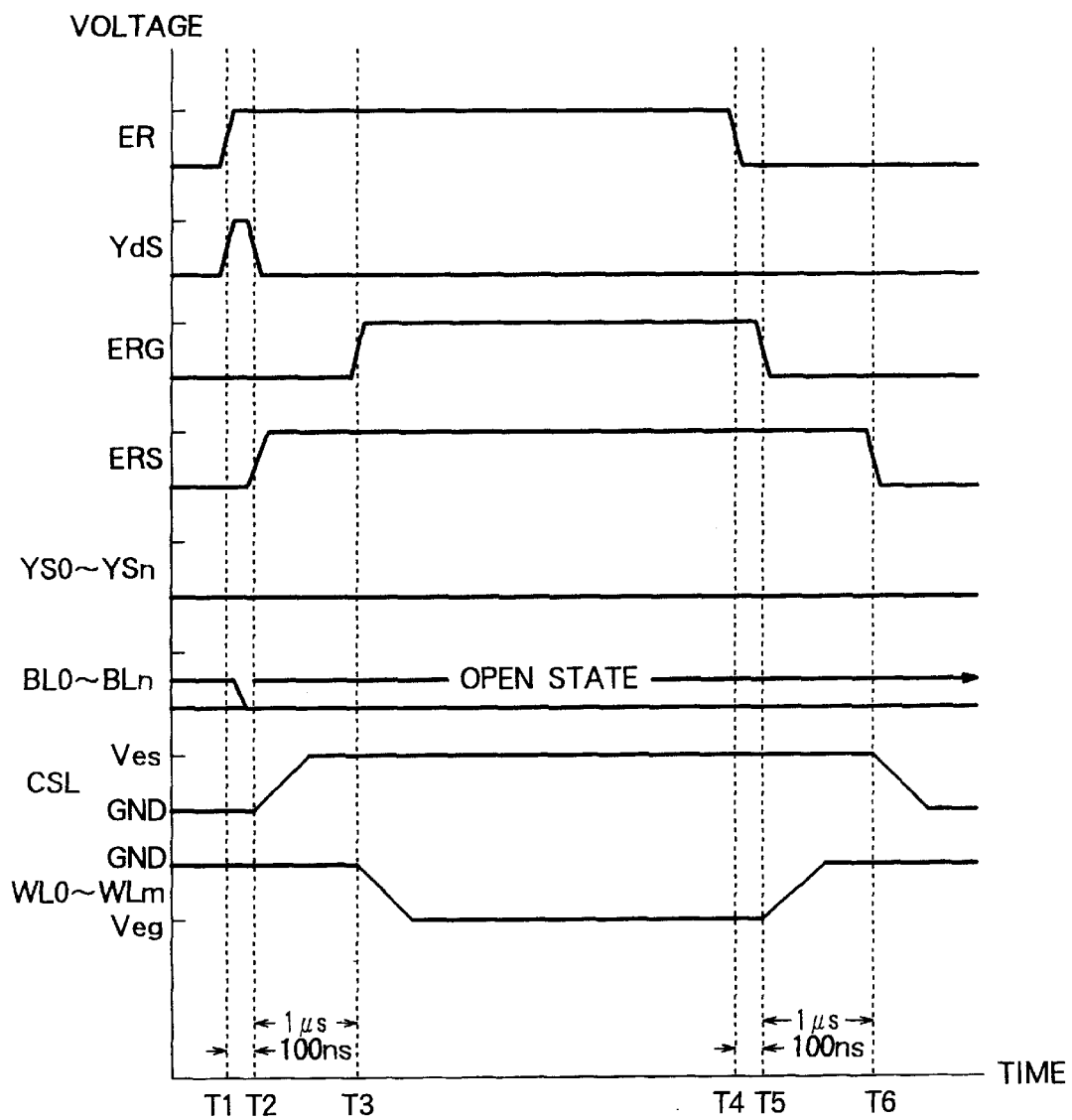
FIG. 3 is a view illustrating waveforms of signals obtained at various points in the erasing device in FIG. 1.
Figure 4:
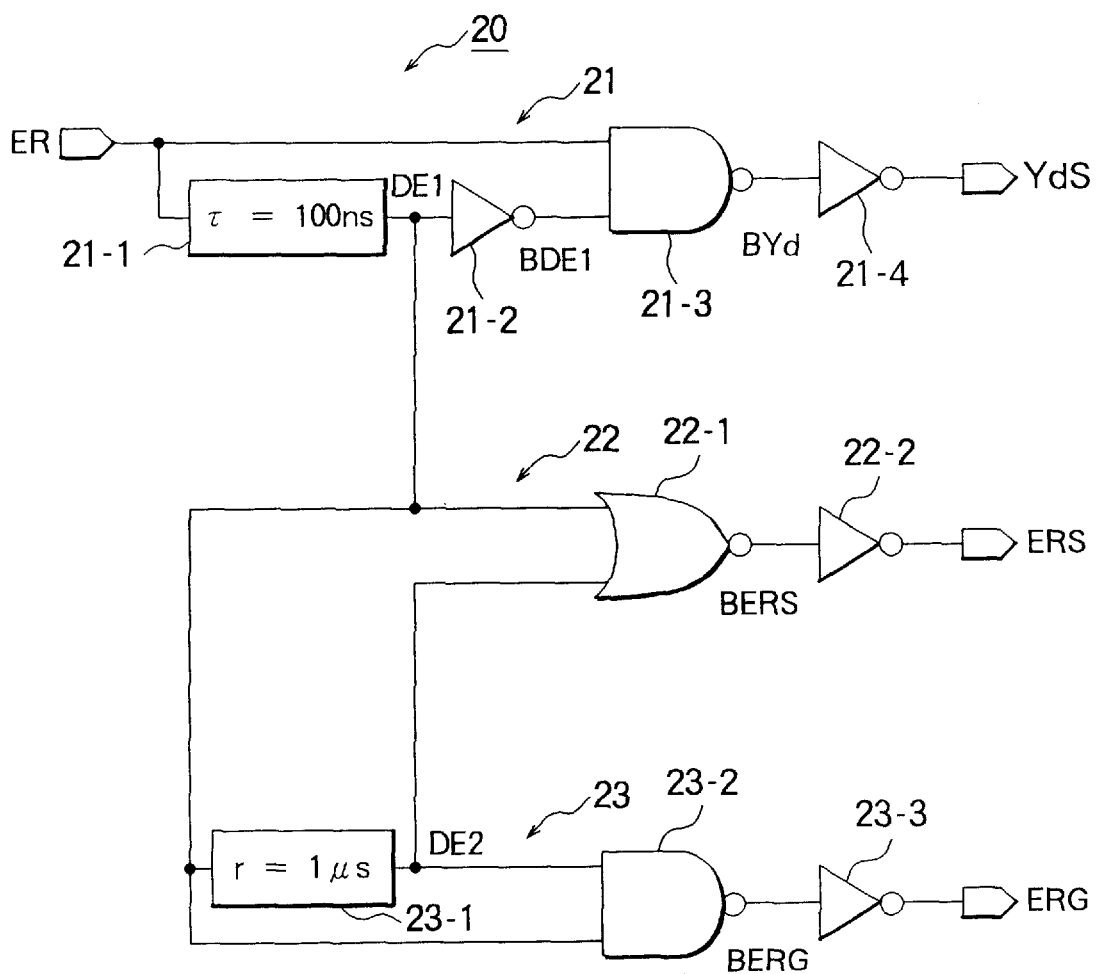
FIG. 4 is a diagram showing an exemplified circuit for generating control signals supplied to individual components in the erasing device in FIG. 1.
Figure 5:
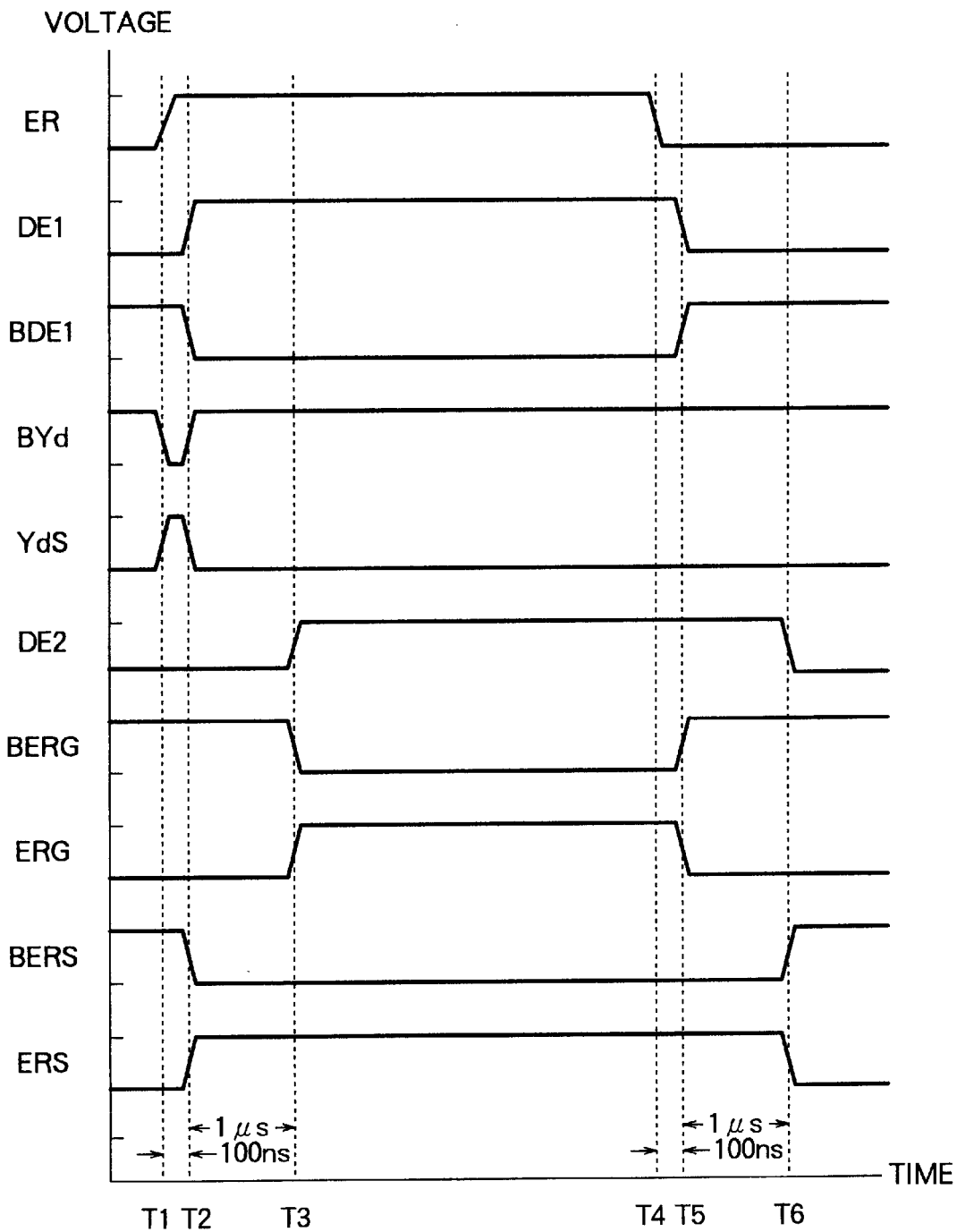
FIG. 5 is a view illustrating waveforms of signals obtained at various points in the generation circuit in FIG. 4.

In FIGS. 1 through 3, the erasing operation can be classified into two steps: an initial erasing step (first erasing mode) and an erasing operation termination step (second erasing mode). In the initial erasing step, the signal supply unit 20 generates the column discharge control signal YdS in response to the above-mentioned erasing signal ER. As a result, the column discharge transistors Yd are turned on, i.e., are conducted, to discharge the voltages across the drains of the individual memory cells at a step S1. The time required for this is as short as, for example, 100 ns. When the column discharge transistors Yd are turned off, then the column lines BL0 through BLn are opened. As a result, the drains of the memory cells are opened at a step S2.

The signal supply unit 20 generates the erasing source control signal ERS after the column discharge transistors Yd are turned off. In response to the erasing source control signal ERS, the source voltage supply circuit 14 applies a positive voltage Ves to the sources of the memory cells MC00 through MCmn through the common source line CSL. The signal supply unit 20 generates the erasing gate control signal ERG after the raise of the erasing source control signal ERS (1 μs, herein). In response to the erasing gate control signal, the negative voltage supply circuit 15 applies a negative voltage Veg to the gates of the memory cells MC00 through MCmn through the row decoder 11 and the row lines WL0 through WLm at a step S3-1. Thus the initial erasing step is completed and the erasing operation goes on.

The step S3-1 is required for the erasing operation with the negative voltage. This step is omitted when the erasing operation is performed with the gates of the memory cells being at 0 (V). In such a case, the negative voltage supply circuit 15 and associated components are also omitted.

During the erasing operation termination step, a step S4 is carried out when the erasing signal ER becomes off. At the step S4, the signal supply unit 20 turns the erasing gate control signal ERG off to force the gates (row lines WL0 through WLm) of the memory cells to be at the ground level. After an elapse of a predetermined time (e.g., 1 μs) after the erasing gate control signal ERG is turned off, a step S5 is performed. At the step S5, the signal supply unit 20 turns the erasing source control signal ERS off to force the sources (common source lines CLS) of the memory cells to be at the ground level. This completes the erasing operation termination step.

In this embodiment, a step S6 is carried out after the step S5 in preparation for erasing verify after the erasing operation. The step S6 is for discharging the drains (column lines BL0 through BLn) of the memory cells. Though not illustrated in FIG. 3, the column discharge control signal YdS is turned on for a period similar to that at the step S1.

Next, the signal supply unit 20 is described with reference to FIGS. 1 and 4. The first signal generation circuit 21 has a first delay circuit 21-1, an inverter 21-2, an NAND circuit 21-3, and an inverter 21-4. The first delay circuit 21-1 delays the erasing signal ER by a predetermined time to produce a first delay signal DE1. The inverter 21-2 inverts the first delay signal DE1 to produce an inverted signal BDE1. The NAND circuit 21-3 receives the erasing signal ER and the inverted signal BDE1 to produce an NAND signal BYd. The inverter 21-4 inverts the NAND signal BYd to produce an inverted signal as the column discharge control signal YdS. The above-mentioned predetermined time is a substantial time during which the column discharge control signal YdS is kept in the on-state, which is approximately equal to 100 ns herein.

The second signal generation circuit 22 has an NOR circuit 22-1 and an inverter 22-2. The NOR circuit 22-1 receives the first delay signal DE1 and a second delay signal DE2 that is an output of a second delay circuit 23-1 (described later) in the third signal generation circuit 23. The inverter 22-2 inverts the output of the NOR circuit 22-1, i.e., an NOR signal BERS to produce an inverted signal as the erase source control signal ERS.

The third signal generation circuit 23 comprises a second delay circuit 23-1, an NAND circuit 23-2, and an inverter 23-3. The second delay circuit 23-1 delays the first delay signal DE1 delivered from the first delay circuit 21-1 by a predetermined time and produces the second delay signal DE2. The NAND circuit 23-2 receives the first and the second delay signals DE1 and DE2. The inverter 23-3 inverts an NAND signal BERG that is an output of the NAND circuit 23-2 to produce an inverted signal as the erasing gate control signal ERG. The above-mentioned predetermined time is a duration from rising up of the erasing source control signal ERS to rising up of the erasing gate control signal ERG, which is approximately equal to 1 $\mu$s herein.

Figure 6:
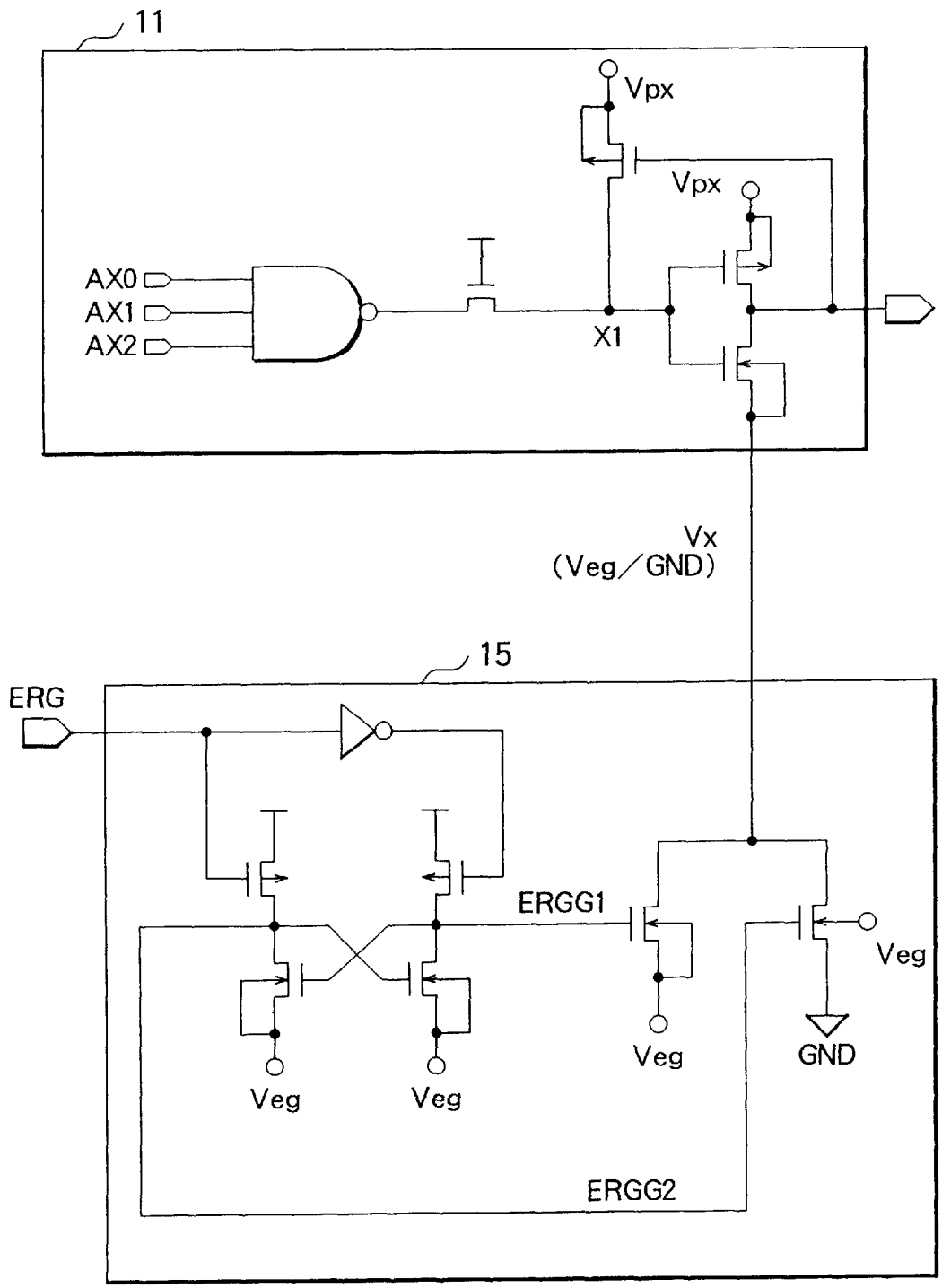
FIG. 6 is a circuit diagram showing exemplified row line decoder and negative voltage supply circuit in FIG. 1.
Figure 7:
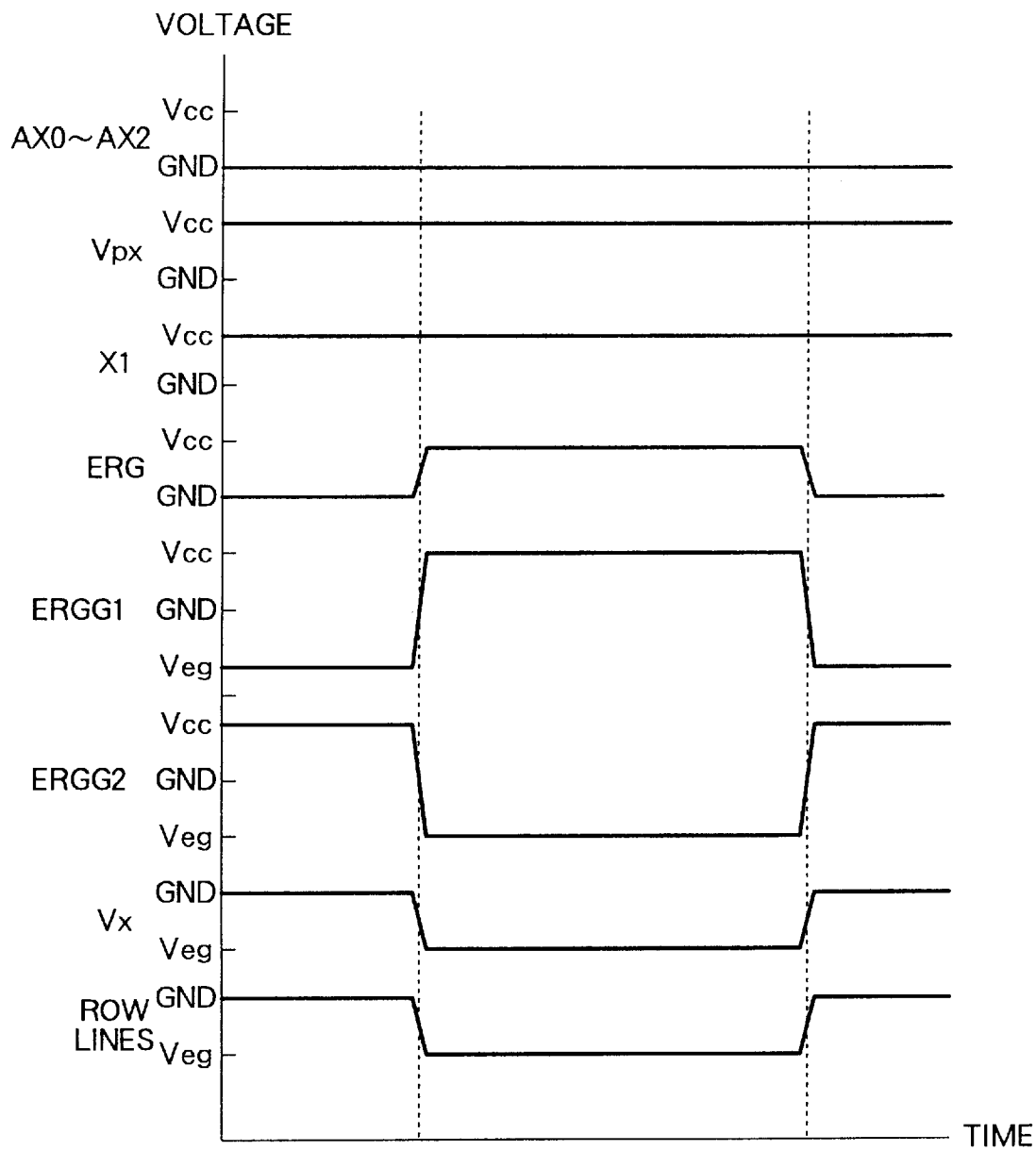
FIG. 7 is a view illustrating waveforms of signals obtained at various points in the circuit in FIG. 6.

Just for a reference, FIG. 6 illustrates the row decoder 11 per one row line and an exemplified negative voltage supply circuit 15. FIG. 7 shows signal waveforms obtained at various points in FIG. 6, which are not a subject of the present invention and are described only briefly rather than in detail, as in the source voltage supply circuit 14.

Figure 8:
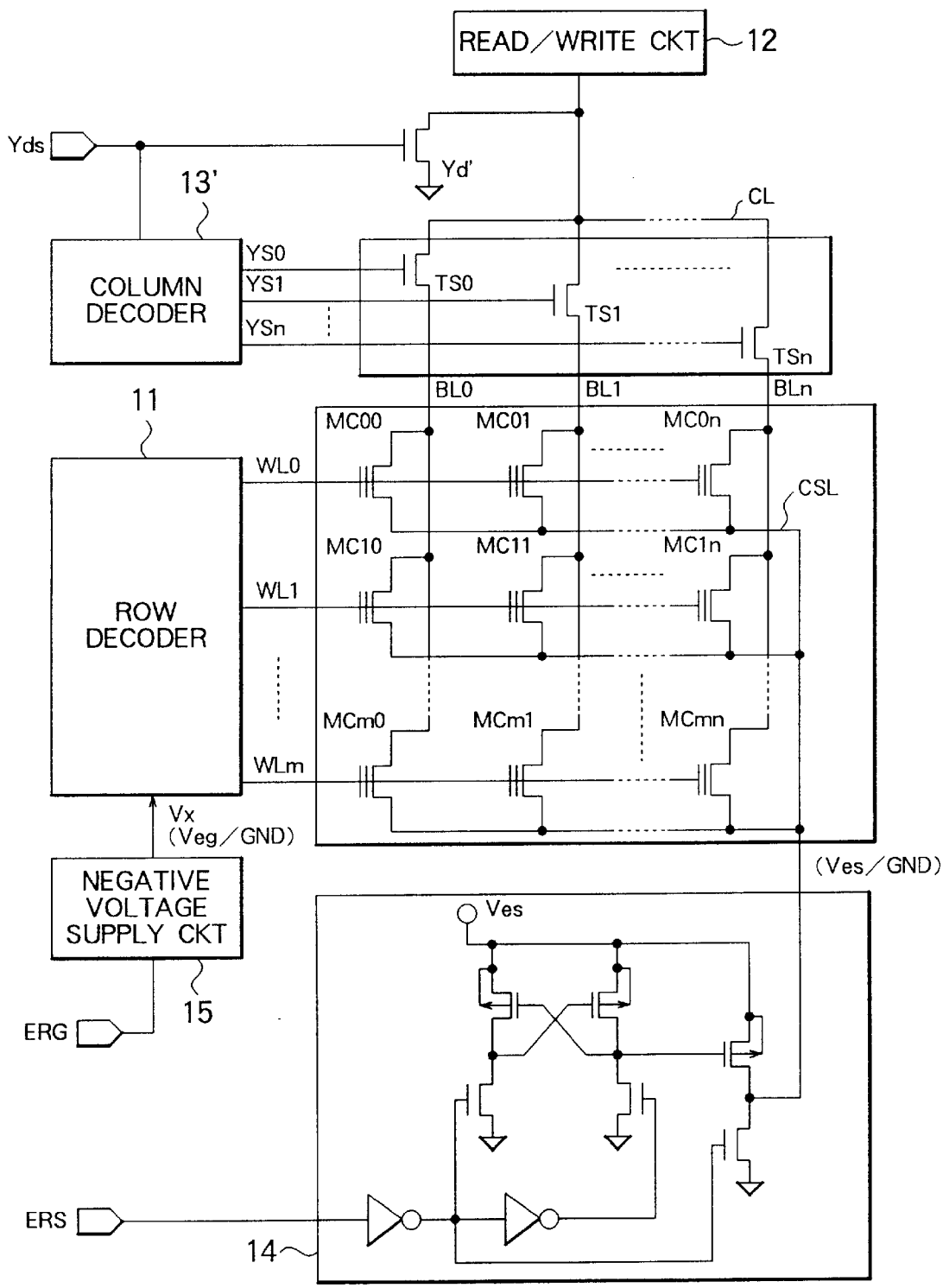
FIG. 8 is a view showing a part of a non-volatile semiconductor memory and a device for erasing a non-volatile semiconductor memory according to a second embodiment of the present invention.

Referring to FIG. 8, a method for erasing a non-volatile semiconductor memory according to a second embodiment of the present invention is described. FIG. 8 shows a part of a semiconductor memory and associated components, as well as an erasing device. In FIG. 8, similar components and parts to those in FIG. 1 are denoted by the same reference numerals as in FIG. 1 and description thereof will be omitted. This embodiment is intended to realize the steps S1 and S2 in FIG. 2 with means that is different to the one in FIG. 1. More specifically, a single column discharge transistor Yd' is used in place of the column discharge transistors Yd in FIG. 1. The column discharge transistor Yd' may be referred to as a second transistor. A drain of the column discharge transistor Yd' is connected to a common connection line CL of the column selection transistors TS0 through TSn. A source of the column discharge transistor Yd' is grounded and a gate thereof is connected to the first signal generation circuit 21 (FIG. 4) of the signal supply unit 20. The column discharge transistor Yd' is turned on at the same timing as that described in conjunction with the column discharge transistor Yd in FIG. 3. Therefore, the signal waveforms obtained at various points are the same as those described with reference to FIG. 3, except that the column selection transistors TS0 through TSn are turned on simultaneously.

Figure 9:
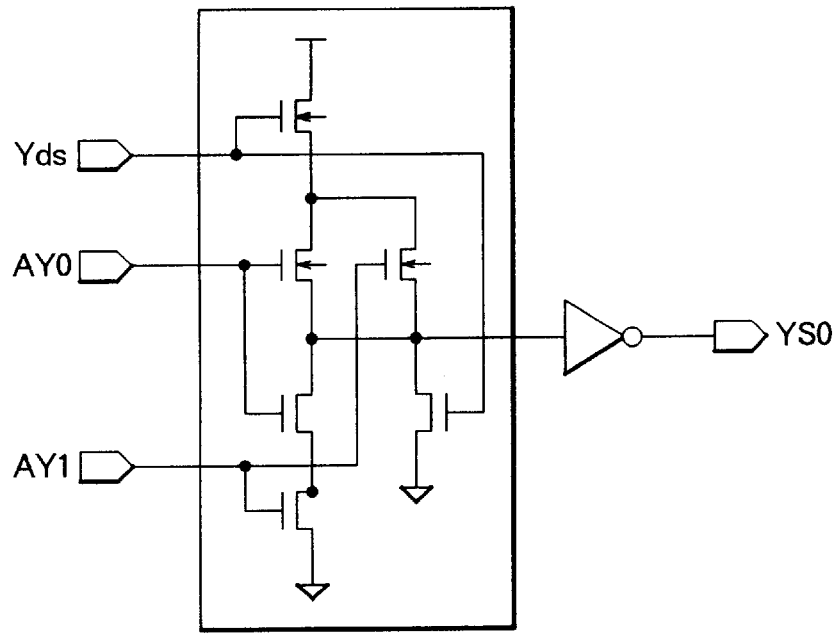
FIG. 9 is a circuit diagram showing a part of internal configuration of a column decoder in FIG. 8.
Figure 9:
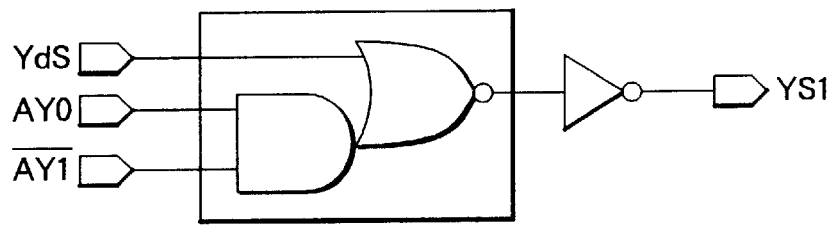
Figure 9:
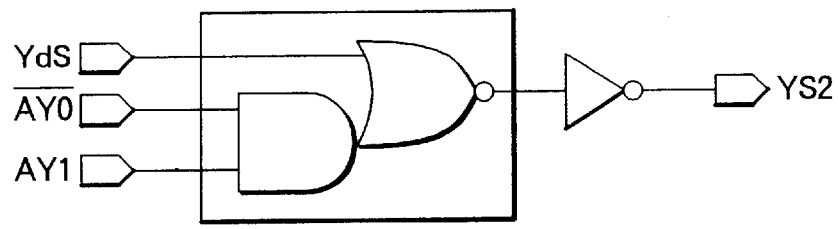
Figure 9:
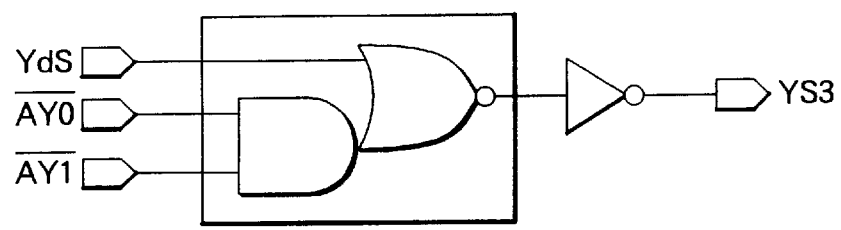

FIG. 9 shows partially (from column selection lines YS0 to YS3) internal configuration of a column decoder 13' for use in turning on the column selection transistors TS0 through TSn in synchronism with the on-timing for the column discharge transistor Yd'. As apparent from FIG. 9, the column decoder 13' is configured such that the column selection transistors TS0 through TSn are turned on in response to the reception of the column discharge control signal YdS.

The source of the column discharge transistors Yd and Yd' is grounded both in the first and second embodiment. However, the source may be connected to a voltage that is lower than the positive voltage applied to the sources of the memory cells.

The present invention optimizes the timing to apply the voltage to the sources and gates for the erasing operation. Accordingly, the drain is prevented from being opened with the potential remained on the drain of the memory cell. This eliminates variation of the capacity ratio across the end of the source and the floating gate of the memory cell, which otherwise may occur column line by column line. In addition, the present invention ensures positive erasing operation by means of the FN tunneling at the end of the source, with the maximum electrical field across the end of the source and the floating gate.

What is claimed is:

1. A method for erasing a non-volatile semiconductor memory in which data are erased from memory cells by means of applying a positive voltage to sources of the individual memory cells while opening drains of the memory cells, wherein said method comprising a first erasing mode successively carrying out:

a first step for discharging the drains of the memory cells to lower the voltage across the drains of the memory cells below the positive voltage applied to the sources; a second step for opening the drains of the memory cells; and a third step for applying the positive voltage to the sources of the memory cells; and a second erasing mode successively carrying out:

a fourth step for forcing the gates of the memory cells to be at the ground level; and a fifth step for forcing the sources of the memory cells to be at the ground level.

2. A method for erasing a non-volatile semiconductor memory as claimed in claim 1, wherein the first and the second steps are carried out with a plurality of first transistors which are connected to column lines for the memory cells.

3. A method for erasing a non-volatile semiconductor memory as claimed in claim 1, wherein the first and the second steps are carried out with a single second transistor which is connected to a common connection line for column selection transistors provided for individual column lines for the memory cells.

4. A method for erasing a non-volatile semiconductor memory as claimed in claim 2, wherein a step for applying a negative voltage to the gates of the memory cells is carried out after said third step for applying the positive voltage to the sources.

5. A method for erasing a non-volatile semiconductor memory as claimed in claim 4, wherein a step for discharging the drains is carried out after said fifth step for forcing the sources of the memory cells to be at the ground level.

6. A method for erasing a non-volatile semiconductor memory as claimed in claim 2, wherein the drains of the memory cells are forced to be at the ground level in said first step by means of grounding the source of said first transistor.

7. A method for erasing a non-volatile semiconductor memory as claimed in claim 3, wherein the drains of the memory cells are forced to be at the ground level in said first step by means of grounding the source of said second transistor.

8. A device for erasing a non-volatile semiconductor memory in which data are erased from memory cells by means of applying a positive voltage to sources of the individual memory cells while opening drains of the memory cells, wherein said device comprising:

first means for discharging the drains of the memory cells to lower the voltage across the drains of the memory cells below the positive voltage applied to the sources and then opening the drains of the memory cells;

second means for applying the positive voltage to the sources of the memory cells after the drains are opened; and third means for forcing the gates of the memory cells to be at the ground level during erasing operation;

said second means forcing the sources of the memory cells to be at the ground level after the gates of the memory cells are forced to be at the ground level by said third means.

9. A device for erasing a non-volatile semiconductor memory as claimed in claim 8, wherein said first means comprises a plurality of first transistors each having a source that is connected to a column line for each memory cells; and supply means for supplying a column discharge control signal at a first predetermined timing to gates of the first transistors.

10. A device for erasing a non-volatile semiconductor memory as claimed in claim 8, wherein said first means comprises a single second transistor that is connected to a common connection line for column selection transistors provided for respective column lines for the memory cells, and supply means for supplying a column discharge control signal at a first predetermined timing to a gate of the second transistor.

11. A device for erasing a non-volatile semiconductor memory as claimed in claim 9, wherein said second means comprises a source voltage supply circuit connected to the sources of the memory cells, and supply means for supplying an erasing source control signal at a second predetermined timing to the source voltage supply circuit.

12. A device for erasing a non-volatile semiconductor memory as claimed in claim 11, wherein said third means comprises a negative voltage supply circuit for applying a negative voltage to a row decoder, the row decoder being connected to the gates of the memory cells to select a row line, and supply means for supplying the erasing gate control signal to the negative voltage supply circuit, the supply means supplying a negative voltage to the gates of the memory cells after the supply of a positive voltage to the sources of the memory cells by means of said second means at the beginning of the erasing operation, and supplying the erasing gate control signal to force the gates of the memory cells to be at the ground level when the erasing operation is completed.

13. A device for erasing a non-volatile semiconductor memory as claimed in claim 12, said second means makes the drains of the memory cells discharge after forcing the sources of the memory cells to be at the ground level upon completion of the erasing operation.

14. A device for erasing a non-volatile semiconductor memory as claimed in claim 9, wherein the first transistors each has a source that is grounded.

15. A device for erasing a non-volatile semiconductor memory as claimed in claim 10, wherein the second transistor has a source that is grounded.

* * * * *